(12) United States Patent
Ye (10) Patent No.: US 11,415,621 B2
(45) Date of Patent: Aug. 16, 2022

(54) CRACK DETECTING CIRCUIT AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 201 days.

(21) Appl. No.: 16/640,671

(22) PCT Filed: Dec. 12, 2019

(86) PCT No.: PCT/CN2019/124722
§ 371 (c)(1),
(2) Date: Feb. 20, 2020

(87) PCT Pub. No.: WO2021/068402
PCT Pub. Date: Apr. 15, 2021

(65) Prior Publication Data
US 2022/0003810 A1 Jan. 6, 2022

(30) Foreign Application Priority Data

Oct. 8, 2019 (CN) .......................... 201910951001.7

(51) Int. Cl.
*G06F 3/041* (2006.01)
*G01R 31/28* (2006.01)

(52) U.S. Cl.
CPC ....... *G01R 31/2831* (2013.01); *G06F 3/0412* (2013.01)

(58) Field of Classification Search
None
See application file for complete search history.

(56) References Cited

U.S. PATENT DOCUMENTS

| | | | |
|---|---|---|---|
| 2014/0176844 A1 | 6/2014 | Yanagisawa | |
| 2019/0213935 A1* | 7/2019 | Jung | .................... H01L 27/3211 |
| 2020/0025820 A1 | 1/2020 | Zhao et al. | |
| 2020/0273919 A1 | 8/2020 | Ding et al. | |

FOREIGN PATENT DOCUMENTS

| | | |
|---|---|---|
| CN | 108922462 A | 11/2018 |
| CN | 109901747 A | 6/2019 |
| CN | 109979366 A | 7/2019 |
| CN | 110070811 A | 7/2019 |
| CN | 110264891 A | 9/2019 |

\* cited by examiner

*Primary Examiner* — Brian M Butcher (57) ABSTRACT

A crack detecting circuit and a display panel are provided. The 1 crack detecting circuit includes an annular detecting wiring, an external signal wiring, and a sub pixel display wiring which are electrically coupled together. The annular detecting wiring is disposed annularly. One terminal of the sub pixel display wiring is electrically coupled to a signal output terminal of the annular detecting wiring, and the other terminal of the sub pixel display wiring is electrically coupled to a drain scan line of a sub pixel. The display panel includes the above-mentioned crack detecting circuit.

9 Claims, 5 Drawing Sheets

CRACK DETECTING CIRCUIT AND DISPLAY PANEL

TECHNICAL FIELD

The present disclosure relates to a technology field of displays, and more particularly to a crack detecting circuit and a display panel.

BACKGROUND

With the rapid development of smart phones towards the direction of fullscreen, a requirement for a screen-to-body ratio is getting higher and higher. Currently, in a notch design of an iPhone X, only an area on a "forehead" of the mobile phone is reserved for a front camera. The rest is a display area.

To achieve a larger screen-to-body ratio, a scheme of under-display camera is introduced by manufacturers of the smart phones. That is, a circular opening design is used in an active-matrix organic light-emitting diode (AMOLED) flexible screen. A circular hole of the AMOLED screen corresponding to a position of a front camera is disposed to expose the camera, so that a screen-to-body ratio of a smart phone is further increased and the AMOLED is closer to a fullscreen than the notch design. However, it is necessary to dispose an opening regardless of which one of the two types.

Figure 1:
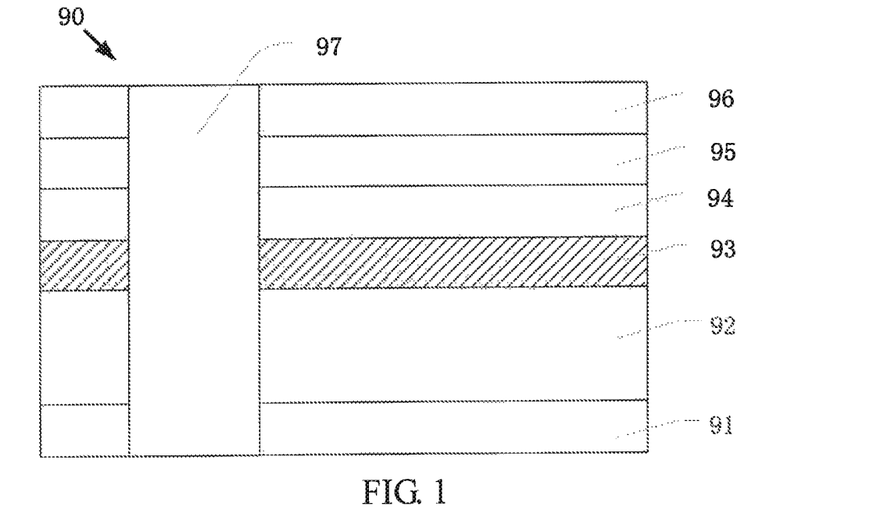
FIG. 1 illustrates a structure diagram of a conventional display panel.

As shown in FIG. 1, a conventional display panel 90 sequentially includes a flexible substrate 91, a thin film transistor layer 92, an organic light-emitting layer 93, a thin film encapsulation layer 94, a touch layer 95, and a glass cover 96 from bottom to top. A circular opening 97 is disposed in the display panel 90 and penetrates the display panel 90. The circular opening 97 is usually formed by laser or mechanical punching, but cracks are easily generated surrounding the periphery of the circular opening 97 of the display panel 90. A position of the circular opening 97 is an opening area. When the cracks are generated in the area, display in the periphery of the opening area is abnormal and a function of the touch layer 95 is disabled.

Consequently, the problem of detecting whether the cracks are generated in the opening area needs to be solved.

SUMMARY OF DISCLOSURE

To solve the above-mentioned problem, the present disclosure provide a crack detecting circuit including an annular detecting wiring, an external signal wiring, and a sub pixel display wiring.

To solve the above-mentioned problem, the present disclosure provide a crack detecting circuit including an annular detecting wiring, an external signal wiring, and a sub pixel display wiring.

In detail, the annular detecting wiring is disposed annularly. The annular detecting wiring includes a signal input terminal and a signal output terminal. One terminal of the external signal wiring is electrically coupled to the signal input terminal of the annular detecting wiring, and the other terminal of the external signal wiring is configured to input a detecting signal. One terminal of the sub pixel display wiring is electrically coupled to the signal output terminal of the annular detecting wiring, and the other terminal of the sub pixel display wiring is electrically coupled to a drain scan line of a sub pixel.

Further, the annular detecting wiring includes an inner annular wiring, a first outer annular wiring, and a second outer annular wiring. In detail, the inner annular wiring is disposed around an opening. One terminal of the first outer annular wiring is electrically coupled to one terminal of the inner annular wiring. The first outer annular wiring is parallel to one side of the inner annular wiring far away from the opening. The other terminal of the first outer annular wiring is the signal input terminal. One terminal of the second outer annular wiring is electrically coupled to the other terminal of the inner annular wiring. The second outer annular wiring is parallel to one side of the inner annular wiring far away from the opening. The other terminal of the second outer annular wiring is the signal output terminal.

Further, a number of the annular detecting wirings is two or more, and two adjacent ones of the annular detecting wirings are coupled in series.

Further, the sub pixel is one of a red sub pixel, a green sub pixel, and a blue sub pixel.

Further, the crack detecting circuit further includes a sub external signal wiring. One terminal of the sub external signal wiring is electrically coupled to the signal input terminal of the annular detecting wiring, and the other terminal of the sub external signal wiring is configured to input the detecting signal. The sub external signal wiring and the external signal wiring are coupled to form a U shape.

Further, the crack detecting circuit further includes a second sub pixel display wiring. One terminal of the second sub pixel display wiring is electrically coupled to the signal output terminal, and the other terminal of the second sub pixel display wiring is electrically coupled to the drain scan line of the sub pixel. The second sub pixel display wiring, the sub pixel display wiring, and the drain scan line of the sub pixel are coupled to form a closed loop.

Further, the crack detecting circuit further includes a signal detecting terminal. The signal detecting terminal is electrically coupled to one terminal of the drain scan line of the sub pixel.

Further, the crack detecting circuit further includes a sub signal detecting terminal. The sub signal detecting terminal is electrically coupled to one terminal of the drain scan line of the sub pixel.

The present further provides a display panel including the above-mentioned crack detecting circuit.

Further, the annular detecting wiring is disposed in a touch layer of the display panel. The external signal wiring and the sub pixel display wiring are disposed in a thin film transistor layer of the display panel. The annular detecting wiring 1 passes vias disposed in the thin film transistor layer to implement electrical connections to the external signal wiring and the sub pixel display wiring.

Advantages of the present disclosure are described as follows. The present disclosure provides a crack detecting circuit and a display panel capable of using an electrical detecting method or an image detecting method to determine whether a function is poor due to the at least one crack in the opening area during a manufacturing process, thereby preventing defective products having the cracks in the opening area during the manufacturing process from being moved to a next manufacturing process. As such, the defective products can be avoided, and a qualification rate of the products can be increased.

Numerals of components are described as follows.
1: annular detecting wiring 11: signal input terminal 12: signal output terminal 13: inner annular wiring 14: first outer annular wiring 15: second outer annular wiring 2: external signal wiring 21: sub external signal wiring 201: detecting signal input terminal 3: sub pixel display wiring 31: second sub pixel display wiring 4: drain scan line of the sub pixel 41: drain scan line in an odd row 42: a drain scan line in an even row 5: thin film transistor 51: active layer 52: gate insulating layer 53: gate 54: interlayer insulating layer 55: source/drain layer 551: drain 552: source 6: gate scan line 7: signal detecting terminal 71: sub signal detecting terminal 10: crack detecting circuit 20: opening 30: via 100: display panel 101: flexible substrate 102: thin film transistor layer 103: organic light-emitting layer 104: thin film encapsulation layer 105: touch layer 106: glass cover 1021: flat organic layer 1022: anode layer 1023: pixel definition layer 1051: buffer layer 1052: first metal layer 1053: passivation layer 1054: second metal layer 1055: flat layer

DETAILED DESCRIPTION OF EMBODIMENTS

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein is required to have specific orientations or be constructed or operates in the specific orientations. Accordingly, the terms should not be construed as limiting the present disclosure. Furthermore, the terms "first" and "second" are for descriptive purposes only and should not be construed as indicating or implying relative importance or implying the number of technical features. As such, the features defined by the term "first" and "second" may include one or more of the features explicitly or implicitly. In the description of the present disclosure, the term "more" refers two or more than two, unless otherwise specifically defined.

The present disclosure provides a display panel in which a crack detecting circuit is disposed.

Embodiment 1

Figure 2A:
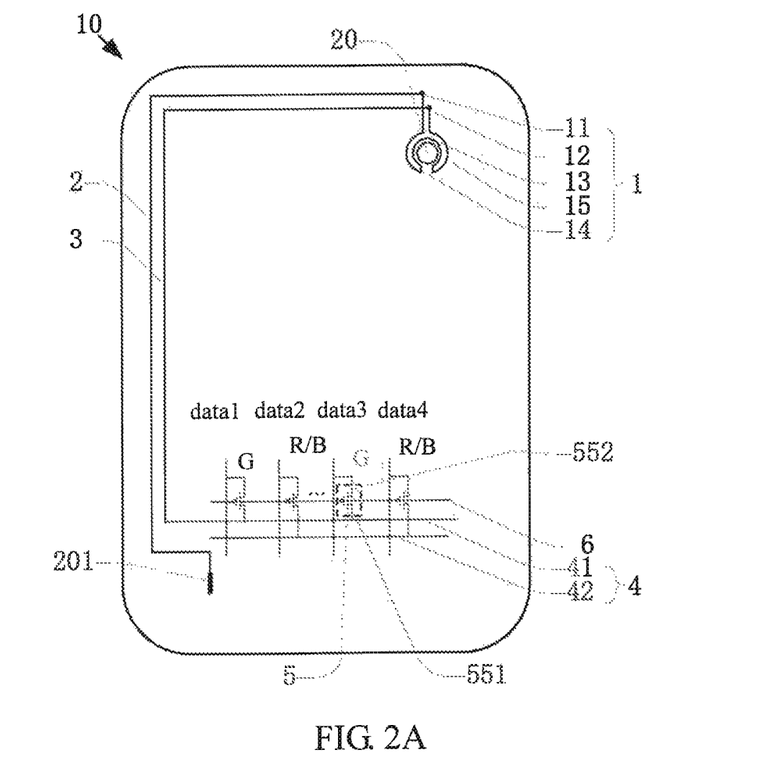
FIG. 2A illustrates a plane structure diagram of a crack detecting circuit in accordance with a first embodiment of the present disclosure.
Figure 2B:
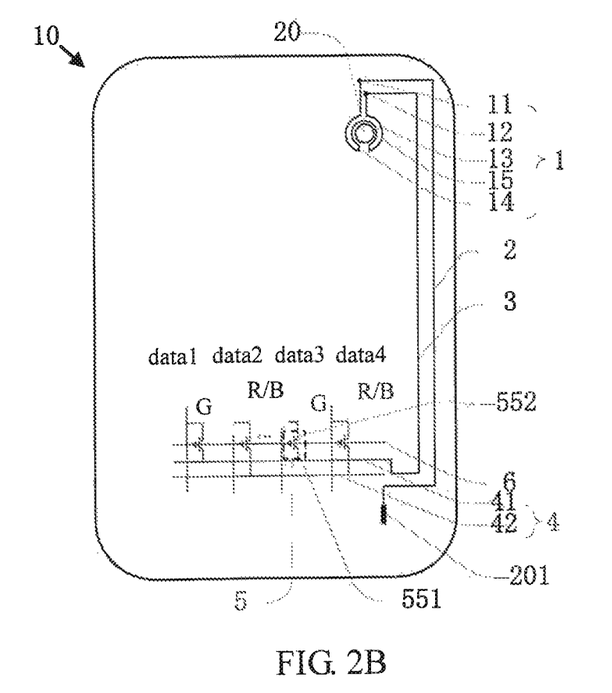
FIG. 2B illustrates another plane structure diagram of the crack detecting circuit in accordance with the first embodiment of the present disclosure.

As shown in the first embodiment in FIG. 2A and FIG. 2B, the crack detecting circuit 10 includes an annular detecting wiring 1, an external signal wiring 2, and a sub pixel display wiring 3.

In detail, the annular detecting wiring 1 is disposed annularly. The annular detecting wiring 1 includes a signal input terminal 11 and a signal output terminal 12. One terminal of the external signal wiring 2 is electrically coupled to the signal input terminal 11 of the annular detecting wiring 1, and the other terminal of the external signal wiring 2 is a detecting signal input terminal 201 configured to input a detecting signal. One terminal of the sub pixel display wiring 3 is electrically coupled to the signal output terminal 12 of the annular detecting wiring 1, and the other terminal of the sub pixel display wiring 3 is electrically coupled to a drain scan line 4 of a sub pixel.

As shown in FIG. 2A, the external signal wiring 2 is disposed at a left side of the display panel, and the drain scan line 4 of the sub pixel is also disposed at the left side of the display panel. As shown in FIG. 2B, the external signal wiring 2 is disposed at a right side of the display panel, and the drain scan line 4 of the sub pixel is also disposed at the right side of the display panel. In another embodiment, the external signal wiring 2 and the drain scan line 4 of the sub pixel may be respectively disposed at the left side and the right side of the display panel.

In the present embodiment, the drain scan line 4 of the sub pixel is electrically coupled to a drain 551 of a thin film transistor 5. A source 552 of the thin film transistor 5 is electrically coupled to a data line of the sub pixel. A gate 53 of the thin film transistor 5 is electrically coupled to a gate scan line 6. The gate scan line 6 is connected to an enable signal. An active layer 51 of the thin film transistor 5 is implemented, by an electric field, to form a channel, so as to turn on the thin film transistor 5.

The crack detecting circuit 10 is configured to detect whether at least one crack exists in an opening area of the display panel. The crack detecting circuit 10 is used in the following two situations.

When the at least one crack does not exist in the opening area (that is, the annular detecting wiring 1 does not have an open circuit), the detecting signal having a high voltage level is inputted to the signal input terminal 11. The detecting signal passes the external signal wiring 2, the annular detecting wiring 1, and the sub pixel display wiring 3 and then enters the drain scan line 4 of the sub pixel. The drain scan line 4 of the sub pixel is electrically coupled to the drain 551 of the thin film transistor 5. The thin film transistor 5 is in a turned-off state. Black is displayed by the sub pixel.

When the at least one crack exists in the opening area (that is, the annular detecting wiring 1 has an open circuit), the detecting signal having the high voltage level and inputted to the signal input terminal 11 cannot be electrically coupled to the drain scan line 4 of the sub pixel. The detecting signal having the high voltage level is suspended. That is, when the detecting signal is in a low voltage level, the thin film transistor 5 is in a turned-on state. A bright line is displayed by the sub pixel.

In the present embodiment, monitoring whether the green bright line exists determines whether the at least one crack exists in the opening area and is simple and easily operated.

In the present embodiment, the annular detecting wiring 1 includes an inner annular wiring 13, a first outer annular wiring 14, and a second outer annular wiring 15. In detail, the inner annular wiring 13 is disposed around an opening 20. A position of the opening 20 is positioned in the opening area of the display panel. One terminal of the first outer annular wiring 14 is electrically coupled to one terminal of the inner annular wiring 13. The first outer annular wiring 14 is parallel to one side of the inner annular wiring 13 far away from the opening. The other terminal of the first outer annular wiring 14 is the signal input terminal 11. One terminal of the second outer annular wiring 15 is electrically coupled to the other terminal of the inner annular wiring 13. The second outer annular wiring 15 is parallel to one side of the inner annular wiring 13 far away from the opening 20. The other terminal of the second outer annular wiring 15 is the signal output terminal 12.

In the present embodiment, the inner annular wiring 13 is a major arc. The first outer annular wiring 14 is a minor arc. The second outer annular wiring 15 is a minor arc. A center of the inner annular wiring 13, a center of the first outer annular wiring 14, and a center of the second outer annular wiring 15 coincide. That is, the inner annular wiring 13, the first outer annular wiring 14, and the second outer annular wiring 15 are concentric circles. Preferably, the first outer annular wiring 14 and the second outer annular wiring 15 are positioned in an arc of the same circle.

Figure 3A:
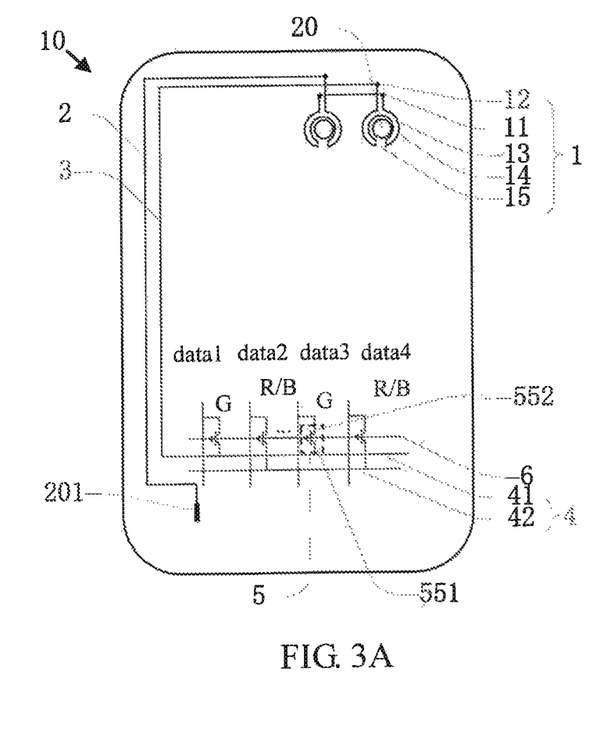
FIG. 3A illustrates a plane structure diagram of a crack detecting circuit in accordance with a second embodiment of the present disclosure.
Figure 3B:
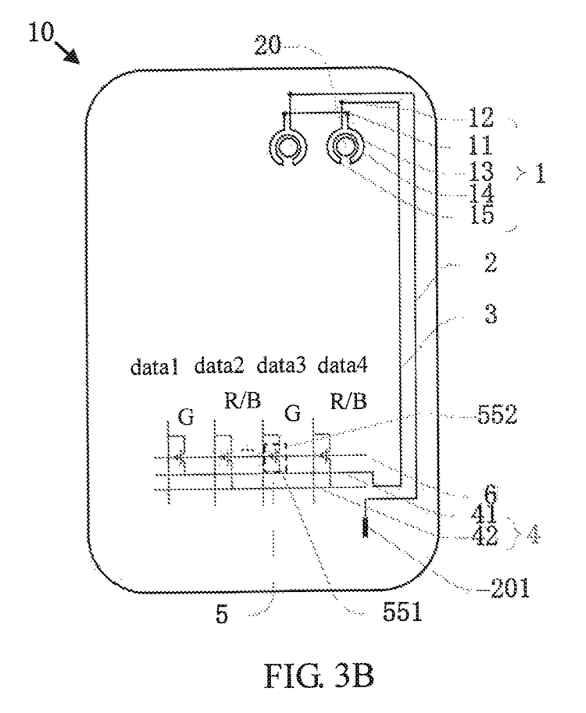
FIG. 3B illustrates another plane structure diagram of the crack detecting circuit in accordance with the second embodiment of the present disclosure.

As shown in the present embodiment in FIG. 3A and FIG. 3B, a number of the annular detecting wirings 1 may be two or more. Two adjacent ones of the annular detecting wirings 1 are coupled in series. That is, the signal output terminal 12 of one of the two adjacent ones of the annular detecting wirings 1 is electrically coupled to the signal input terminal 11 of the other of the two adjacent ones of the annular detecting wirings 1, so that the two adjacent ones of the annular detecting wirings 1 are coupled in series. A connecting wiring of coupling the two adjacent ones of the annular detecting wirings 1 in series may be positioned in a layer different from a layer of the annular detecting wirings 1. It is necessary to form a via penetrating the layers between the layer of the connecting wiring and the layer of the annular detecting wirings 1. The connecting wiring passes the via to implement the electrical connection to the annular detecting wirings 1.

As shown in FIG. 2A and FIG. 3A, the external signal wiring 2 is disposed at the left side of the display panel, and the drain scan line 4 of the sub pixel is also disposed at the left side of the display panel. As shown in FIG. 2B and FIG. 3B, the external signal wiring 2 is disposed at the right side of the display panel, and the drain scan line 4 of the sub pixel is also disposed at the right side of the display panel. A difference between FIGS. 3A-3B and FIGS. 2A-2B is that the external signal wirings 2 in FIGS. 3A-3B may be two or more. In another embodiment, the external signal wiring 2 and the drain scan line 4 of the sub pixel may be respectively disposed at the left side and the right side of the display panel.

In the present embodiment, the sub pixel is one of a red sub pixel, a green sub pixel, and a blue sub pixel. In a preferred embodiment, the sub pixel is a green sub pixel. That is, a green color is displayed for configuring to detecting a color of the display panel. When the at least one crack does not exist in the opening area (that is, the annular detecting wiring 1 does not have the open circuit), the detecting signal having the high voltage level is inputted to the signal input terminal 11 and black is displayed by the sub pixel. When the at least one crack exists in the opening area (that is, the annular detecting wiring 1 has the open circuit), the detecting signal having the high voltage level is inputted to the signal input terminal 11 and a green bright line is displayed by the sub pixel. Monitoring whether the green bright line exists determines whether the at least one crack exists in the opening area and is simple and easily operated.

As shown in FIGS. 2A-2B and FIGS. 3A-3B, since the red sub pixel, the green sub pixel, and the blue sub pixel are usually disposed and distributed in a triangle matrix, the drain scan line 4 of the sub pixel of the present disclosure includes a drain scan line 41 in an odd row and a drain scan line 42 in an even row. The drain scan line 41 in the odd row is electrically coupled to the drain 551 in the green sub pixel. The drain scan line 41 in the even row is electrically coupled to the drain 551 in the red sub pixel and the drain 551 in the blue sub pixel. In one preferred embodiment, the other terminal of the sub pixel display wiring 3 is electrically coupled to the drain scan line 41 in the odd row. That is, the terminal of the sub pixel display wiring 3 is electrically coupled to the drain 551 in the green sub pixel. As such, when compared to a situation that the other terminal of the sub pixel display wiring 3 is electrically coupled to the drain scan line 42 in the even row, a situation that the terminal of the sub pixel display wiring 3 is electrically coupled to the drain scan line 41 in the odd row can save more power.

Embodiment 2

Figure 4A:
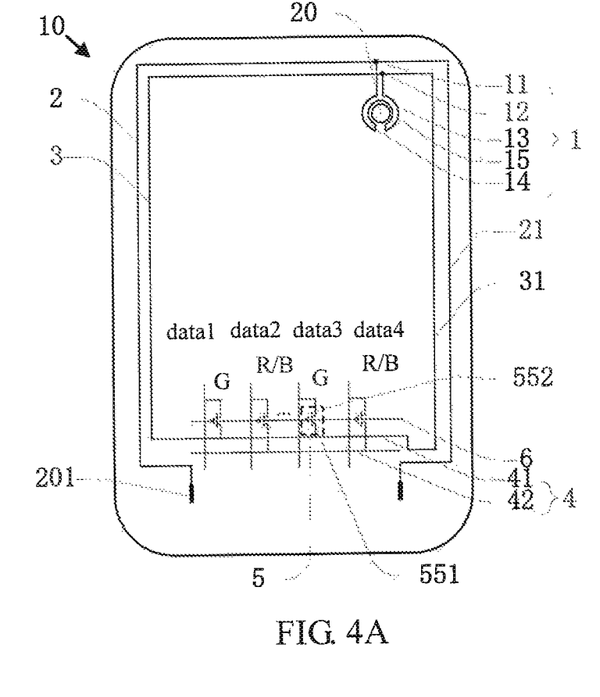
FIG. 4A illustrates a plane structure diagram of a crack detecting circuit in accordance with a third embodiment of the present disclosure.
Figure 4B:
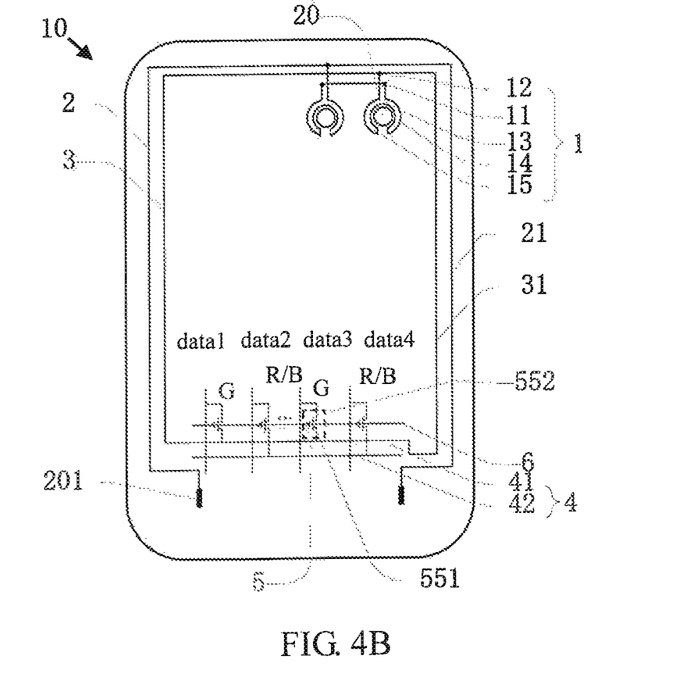
FIG. 4B illustrates another plane structure diagram of the crack detecting circuit in accordance with the third embodiment of the present disclosure.

A second embodiment as shown in FIG. 4A and FIG. 4B includes all technical features in the first embodiment. A difference is that the crack detecting circuit 10 in the second embodiment further includes a sub external signal wiring 21.

A number of the annular detecting wiring 1 in FIG. 4A is one. A number of the annular detecting wirings 1 in FIG. 4B is two or more.

One terminal of the sub external signal wiring 21 is electrically coupled to the signal input terminal 11 of the annular detecting wiring 1, and the other terminal of the sub external signal wiring 21 is the detecting signal input terminal 201 configured to input the detecting signal. The sub external signal wiring 21 and the external signal wiring 2 are coupled to form a U shape. The sub external signal wiring 21 and the external signal wiring 2 are approximately disposed in a mirror manner with respect to a symmetric axis of the annular detecting wiring 1.

When the external signal wiring 2 and the sub external signal wiring 21 coexist, the detecting signal can be inputted to one of the external signal wiring 2 and the sub external signal wiring 21 to implement a detecting function. In one aspect, an operation of the present disclosure is simple. In another aspect, a situation that a detecting result is affected because one of the external signal wiring 2 and the sub external signal wiring 21 has an open circuit can be avoided. A detecting test is performing by sequentially inputting the detecting signal to the external signal wiring 2 and the sub external signal wiring 21. The display panel is normal as long as one detecting result of the external signal wiring 2 and the sub external signal wiring 21 is normal. This detecting method can decrease an error and increase accuracy of the detecting test.

In the present embodiment as shown in FIG. 4A and FIG. 4B, the crack detecting circuit 10 further includes a second sub pixel display wiring 31. One terminal of the second sub pixel display wiring 31 is electrically coupled to the signal output terminal 12, and the other terminal of the second sub pixel display wiring 31 is electrically coupled to the drain scan line 4 of the sub pixel. The second sub pixel display wiring 31, the sub pixel display wiring 3, and the drain scan line 4 of the sub pixel are coupled to form a closed loop. When the sub pixel display wiring 3 and the second sub pixel display wiring 31 coexist, a situation that a detecting result is affected because one of the sub pixel display wiring 3 and the second sub pixel display wiring 31 has an open circuit can be avoided.

Embodiment 3

Figure 5A:
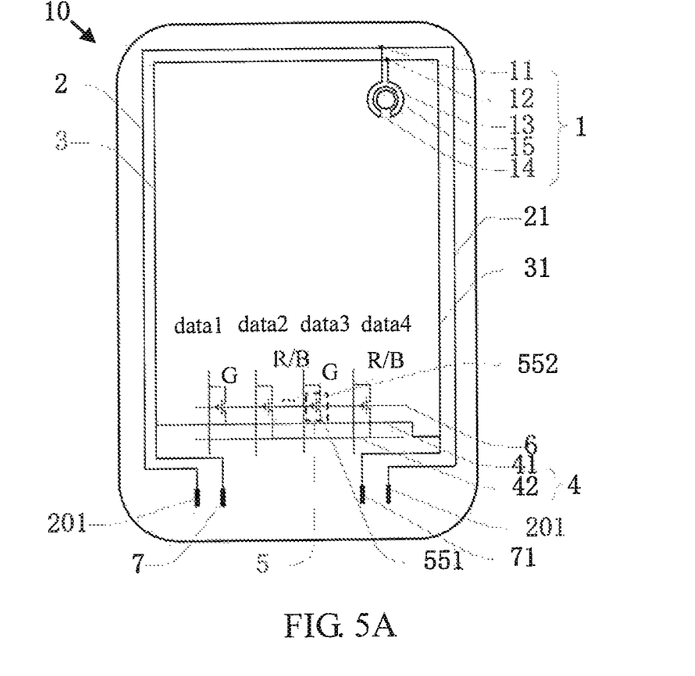
FIG. 5A illustrates a plane structure diagram of a crack detecting circuit in accordance with a fourth embodiment of the present disclosure.
Figure 5B:
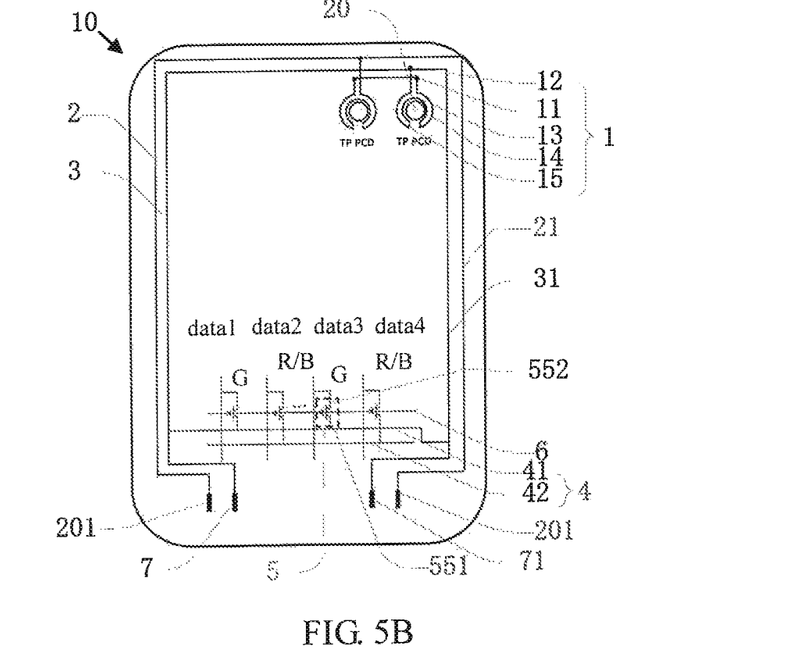
FIG. 5B illustrates another plane structure diagram of the crack detecting circuit in accordance with the fourth embodiment of the present disclosure.

A third embodiment as shown in FIG. 5A and FIG. 5B includes all technical features in the first embodiment and the second embodiment. A difference is that the crack detecting circuit 10 in the third embodiment further includes a signal detecting terminal 7. The signal detecting terminal 7 is electrically coupled to one terminal of the drain scan line 4 of the sub pixel.

The signal detecting terminal 7 is included in the present embodiment based on the second embodiment in FIG. 2. A specific structure is shown in FIG. 5A and FIG. 5B. The drain scan line 4 of the sub pixel is electrically coupled to the sub pixel display wiring 3, and the sub pixel display wiring 3 is electrically coupled to the annular detecting wiring 1. The signal detecting terminal 7 can receive an inputted detecting signal when the signal detecting terminal 7 is electrically coupled to any one terminal of the drain scan line 4 of the sub pixel.

When a detecting operation is performed, only one signal detecting device (not shown) is required to implement the detecting operation of the display panel. The detecting operation is simple. One terminal of the signal detecting device is electrically coupled to the detecting signal input terminal 201, and the other terminal of the signal detecting device is electrically coupled to the signal detecting terminal 7. As such, the detecting signal input terminal 201, the external signal wiring 2 (or the sub external signal wiring 21), the annular detecting wiring 1, the signal detecting terminal 7, and the signal detecting device are coupled to form a closed loop. When the signal detecting device can receive the detecting signal successfully, it is determined that the detected display panel is normal. When the signal detecting device cannot receive the detecting signal successfully, it is determined that the detected display panel is abnormal.

In the present preferred embodiment, one set of drive ICs is used in the signal detecting device. In the present embodiment, an electrical detecting method is used to determine whether a function is poor due to the at least one crack in the opening area during a manufacturing process.

As shown in FIG. 5A and FIG. 5B, the crack detecting circuit 10 further includes a sub signal detecting terminal 71. The sub signal detecting terminal 71 is electrically coupled to the one terminal of the drain scan line 4 of the sub pixel.

A number of the annular detecting wiring 1 in FIG. 5A is one. A number of the annular detecting wirings 1 in FIG. 5B is two or more.

The drain scan line 4 of the sub pixel is electrically coupled to the second sub pixel display wiring 31, and the second sub pixel display wiring 31 is electrically coupled to the annular detecting wiring 1. The sub signal detecting terminal 71 can receive a signal from the signal input terminal 11 of the annular detecting wiring 1 when the sub signal detecting terminal 71 is electrically coupled to any one terminal of the drain scan line 4 of the sub pixel. Accordingly, in the present embodiment, a position of the signal detecting terminal 7 and a position of the sub signal detecting terminal 71 can be exchanged.

The present disclosure further provides a display panel 100 including the above-mentioned crack detecting circuit 10.

Figure 6:
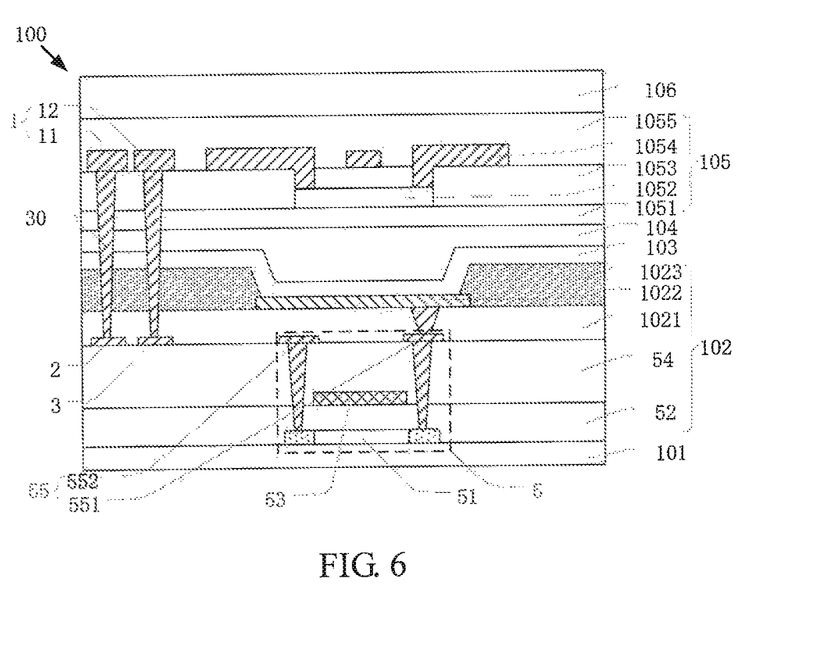
FIG. 6 illustrates a structure diagram of a display panel in accordance with an embodiment of the present disclosure.

As shown in FIG. 6, the display panel 100 sequentially includes a flexible substrate 101, a thin film transistor layer 102, an organic light-emitting layer 103, a thin film encapsulation layer 104, a touch layer 105, and a glass cover 106 from bottom to top.

The thin film transistor layer 102 includes a plurality of thin film transistors 5 disposed on the flexible substrate 101, a flat organic layer 1021 covering the thin film transistors 5, an anode layer 1022 positioned on the flat organic layer 1021, and a pixel definition layer 1023 positioned on the anode layer 1022. Each of the thin film transistors 5 includes an active layer 51, a gate insulating layer 52, a gate 53, an interlayer insulating layer 54, and a source/drain layer 55 which are sequentially stacked from bottom to top. A drain 551 and a source 552 of each of the thin film transistors 5 are positioned in the source/drain layer 55.

The touch layer 105 includes a buffer layer 1051, a first metal layer 1052, a passivation layer 1053, a second metal layer 1054, and a flat layer 1055. In detail, the buffer layer 1051 is positioned on the thin film encapsulation layer 104. The first metal layer 1052 is positioned on the buffer layer 1051. The passivation layer 1053 is positioned on the first metal layer 1052. The second metal layer 1054 is positioned on the passivation layer 1053. The flat layer 1055 is positioned on the second metal layer 1054. The first metal layer 1052 includes a plurality of electrode bridges. The second metal layer 1054 includes a plurality of touch electrodes. A specific structure of the second metal layer 1054 is prior art and not repeated herein.

In the present embodiment, the annular detecting wiring 1 is disposed in the touch layer 105 of the display panel 100. Preferably, the annular detecting wiring 1 and the second metal layer 1054 of the touch layer 105 are disposed in the same layer. That is, when the second metal layer 1054 is manufactured, the annular detecting wiring 1 is formed by a patterning method. The external signal wiring 2 and the sub pixel display wiring 3 are disposed in the thin film transistor layer 102 of the display panel 100. Preferably, the external signal wiring 2, the sub pixel display wiring 3, and the source/drain layer 55 of the thin film transistor layer 102 are disposed in the same layer. That is, when the source/drain layer 55 is manufactured, the external signal wiring 2 and the sub pixel display wiring 3 are formed by a patterning method. The annular detecting wiring 1 passes vias 30 disposed in the thin film transistor layer 102 to implement electrical connections to the external signal wiring 2 and the sub pixel display wiring 3. The vias 30 penetrate layers between the annular detecting wiring 1 and the external signal wiring 2 and the sub pixel display wiring 3. A bottom of each of the vias 30 is the source/drain layer 55. The vias sequentially penetrate the flat organic layer 1021 of the thin film transistor layer 102, the anode layer 1022 of the thin film transistor layer 102, the pixel definition layer 1023 of the thin film transistor layer 102, the organic light-emitting layer 103, the thin film encapsulation layer 104, the active layer 51 of the touch layer 105, the first metal layer 1052 of the touch layer 105, and the passivation layer 1053 of the touch layer 105.

The external signal wiring 2 and the sub pixel display wiring 3 surround a display area of the display panel 100. The sub external signal wiring 21 and the second sub pixel display wiring 31 also surround the display area of the display panel 100. The external signal wiring 2 and the sub external signal wiring 21 may be integrated together. The sub pixel display wiring 3 and the second sub pixel display wiring 31 may also be integrated together.

Advantages of the present disclosure are described as follows. The present disclosure provides a crack detecting circuit and a display panel capable of using an electrical detecting method or an image detecting method to determine whether a function is poor due to the at least one crack in the opening area during a manufacturing process, thereby preventing defective products having the cracks in the opening area during the manufacturing process from being moved to a next manufacturing process. As such, the defective products can be avoided, and a qualification rate of the products can be increased.

The embodiments are used to describe the principle and the implementations of the present disclosure. It should be understood that present disclosure is not limited to the exemplary examples. One of ordinary skill in the art may achieve equivalent improvements or replacements according to the above description. The equivalent improvements and replacements should be considered to belong to the protection scope of the present disclosure.

What is claimed is:

1. A crack detecting circuit, comprising:
   an annular detecting wiring disposed annularly; the annular detecting wiring comprising a signal input terminal and a signal output terminal;
   an external signal wiring, one terminal of the external signal wiring electrically coupled to the signal input terminal of the annular detecting wiring, and the other terminal of the external signal wiring configured to input a detecting signal; and
   a sub pixel display wiring, one terminal of the sub pixel display wiring electrically coupled to the signal output terminal of the annular detecting wiring, and the other terminal of the sub pixel display wiring electrically coupled to a drain scan line of a sub pixel;
   wherein the annular detecting wiring comprises:
   an inner annular wiring disposed around an opening;
   a first outer annular wiring, one terminal of the first outer annular wiring electrically coupled to one terminal of the inner annular wiring; the first outer annular wiring parallel to one side of the inner annular wiring far away from the opening; the other terminal of the first outer annular wiring being the signal input terminal; and
   a second outer annular wiring, one terminal of the second outer annular wiring electrically coupled to the other terminal of the inner annular wiring; the second outer annular wiring parallel to one side of the inner annular wiring far away from the opening; the other terminal of the second outer annular wiring being the signal output terminal.

2. The crack detecting circuit of claim 1, wherein a number of the annular detecting wirings is two or more, and two adjacent ones of the annular detecting wirings are coupled in series.

3. The crack detecting circuit of claim 1, wherein the sub pixel is one of a red sub pixel, a green sub pixel, and a blue sub pixel.

4. The crack detecting circuit of claim 1, further comprising:
   a sub external signal wiring, one terminal of the sub external signal wiring electrically coupled to the signal input terminal of the annular detecting wiring, and the other terminal of the sub external signal wiring configured to input the detecting signal;
   the sub external signal wiring and the external signal wiring coupled to form a U shape.

5. The crack detecting circuit of claim 1, further comprising:
   a second sub pixel display wiring, one terminal of the second sub pixel display wiring electrically coupled to the signal output terminal, and the other terminal of the second sub pixel display wiring electrically coupled to the drain scan line of the sub pixel;
   the second sub pixel display wiring, the sub pixel display wiring, and the drain scan line of the sub pixel coupled to form a closed loop.

6. The crack detecting circuit of claim 1, further comprising:
   a signal detecting terminal, and the signal detecting terminal electrically coupled to one terminal of the drain scan line of the sub pixel.

7. The crack detecting circuit of claim 5, further comprising:
   a sub signal detecting terminal, and the sub signal detecting terminal electrically coupled to one terminal of the drain scan line of the sub pixel.

8. A display panel, comprising the crack detecting circuit of claim 1.

9. The display panel of claim 8, wherein the annular detecting wiring is disposed in a touch layer of the display panel; the external signal wiring and the sub pixel display wiring are disposed in a thin film transistor layer of the display panel; the annular detecting wiring passes vias disposed in the thin film transistor layer to implement electrical connections to the external signal wiring and the sub pixel display wiring.

* * * * *